(12) United States Patent
Essig et al.

(10) Patent No.: US 8,487,426 B2
(45) Date of Patent: Jul. 16, 2013

(54) SEMICONDUCTOR PACKAGE WITH EMBEDDED DIE AND MANUFACTURING METHODS THEREOF

(75) Inventors: Kay Stephan Essig, Leipzig (DE); Bernd Karl Appelt, Gulf Breeze, FL (US); Ming Chiang Lee, Kaohsiung (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 147 days.

(21) Appl. No.: 13/048,836

(22) Filed: Mar. 15, 2011

(65) Prior Publication Data
US 2012/0235309 A1 Sep. 20, 2012

(51) Int. Cl.
*H01L 23/04* (2006.01)
*H01L 23/043* (2006.01)

(52) U.S. Cl.
USPC ........... 257/699; 257/698; 257/708; 257/713; 257/730; 257/E23.051; 257/E23.128

(58) Field of Classification Search
USPC .......... 257/699, 708, 698, 713, 730, E23.051, 257/E23.128
See application file for complete search history.

(56) References Cited

U.S. PATENT DOCUMENTS

| | | | |
|---|---|---|---|
| 3,903,590 A | 9/1975 | Yokogawa | |
| 4,866,501 A | 9/1989 | Shanefield | |
| 5,111,278 A | 5/1992 | Eichelberger | |
| 5,151,769 A * | 9/1992 | Immorlica et al. | 257/659 |
| 5,432,677 A | 7/1995 | Mowatt et al. | |
| 5,497,033 A | 3/1996 | Fillion et al. | |
| 5,565,706 A | 10/1996 | Miura et al. | |
| 5,578,869 A * | 11/1996 | Hoffman et al. | 257/691 |
| 5,745,984 A | 5/1998 | Cole, Jr. et al. | |
| 5,841,190 A | 11/1998 | Noda et al. | |
| 5,841,193 A | 11/1998 | Eichelberger | |
| 5,945,741 A | 8/1999 | Ohsawa et al. | |
| 5,990,553 A * | 11/1999 | Morita et al. | 257/729 |
| 6,028,358 A * | 2/2000 | Suzuki | 257/737 |
| 6,057,593 A * | 5/2000 | Iovdalsky et al. | 257/659 |
| 6,110,608 A | 8/2000 | Tanimoto et al. | |
| 6,159,767 A | 12/2000 | Eichelberger | |
| 6,278,181 B1 | 8/2001 | Maley | |
| 6,400,573 B1 | 6/2002 | Mowatt et al. | |

(Continued)

FOREIGN PATENT DOCUMENTS

| | | |
|---|---|---|
| JP | 2004007006 | 1/2004 |
| TW | I236323 | 7/2005 |

OTHER PUBLICATIONS

Imbera, "IMB Technology". available at http://www.imberacorp.com/imb-technology (brief printable download). Imbera Corporation, Melbourne, FL.

*Primary Examiner* — Nitin Parekh
(74) *Attorney, Agent, or Firm* — Foley & Lardner LLP

(57) ABSTRACT

A semiconductor package includes a conductive base, a die disposed adjacent to an upper surface of the conductive base, a patterned conductive layer, and a dielectric layer encapsulating the die. The dielectric layer defines an opening through which the patterned conductive layer is electrically connected to the upper surface of the conductive base. The conductive base has a lateral surface including a first portion adjacent to the upper surface of the conductive base and a second portion adjacent to a lower surface of the conductive base, where the second portion is sloped inwardly with respect to the lower surface of the conductive base.

20 Claims, 11 Drawing Sheets

U.S. PATENT DOCUMENTS

| | | |
|---|---|---|
| 6,423,570 B1 | 7/2002 | Ma et al. |
| 6,452,258 B1 | 9/2002 | Abys et al. |
| 6,495,914 B1 * | 12/2002 | Sekine et al. ............... 257/723 |
| 6,555,906 B2 | 4/2003 | Towle et al. |
| 6,586,822 B1 | 7/2003 | Vu et al. |
| 6,590,291 B2 | 7/2003 | Akagawa |
| 6,624,523 B2 * | 9/2003 | Chao et al. ............... 257/796 |
| 6,639,324 B1 | 10/2003 | Chien |
| 6,680,529 B2 | 1/2004 | Chen et al. |
| 6,724,638 B1 | 4/2004 | Inagaki et al. |
| 6,734,534 B1 | 5/2004 | Vu et al. |
| 6,734,542 B2 | 5/2004 | Nakatani et al. |
| 6,759,268 B2 | 7/2004 | Akagawa |
| 6,849,945 B2 | 2/2005 | Horiuchi et al. |
| 6,865,089 B2 | 3/2005 | Ho et al. |
| 6,872,893 B2 | 3/2005 | Fukuoka et al. |
| 6,876,544 B2 | 4/2005 | Hsin |
| 6,894,399 B2 | 5/2005 | Vu et al. |
| 6,902,950 B2 | 6/2005 | Ma et al. |
| 6,919,508 B2 * | 7/2005 | Forcier ............... 174/565 |
| 6,930,256 B1 | 8/2005 | Huemoeller et al. |
| 6,939,738 B2 | 9/2005 | Nakatani et al. |
| 6,948,944 B2 | 9/2005 | Ueno |
| 6,964,887 B2 | 11/2005 | Akagawa |
| 6,964,889 B2 | 11/2005 | Ma et al. |
| 6,975,516 B2 | 12/2005 | Asahi et al. |
| 6,991,966 B2 | 1/2006 | Tuominen |
| 7,053,475 B2 | 5/2006 | Akagawa |
| 7,067,356 B2 | 6/2006 | Towle et al. |
| 7,071,024 B2 | 7/2006 | Towle et al. |
| 7,078,788 B2 | 7/2006 | Vu et al. |
| 7,122,901 B2 | 10/2006 | Sunohara et al. |
| 7,141,884 B2 | 11/2006 | Kojima et al. |
| 7,262,497 B2 | 8/2007 | Fang |
| 7,294,529 B2 | 11/2007 | Tuominen et al. |
| 7,294,920 B2 | 11/2007 | Chen et al. |
| 7,294,922 B2 | 11/2007 | Jobetto et al. |
| 7,299,546 B2 | 11/2007 | Tuominen et al. |
| 7,312,103 B1 | 12/2007 | Huemoeller et al. |
| 7,338,892 B2 | 3/2008 | Wang et al. |
| 7,342,803 B2 | 3/2008 | Inagaki et al. |
| 7,352,054 B2 | 4/2008 | Jobetto |
| 7,411,306 B2 | 8/2008 | Leu et al. |
| 7,501,696 B2 | 3/2009 | Koyama et al. |
| 7,511,356 B2 | 3/2009 | Subramanian |
| 7,511,365 B2 | 3/2009 | Wu et al. |
| 7,523,551 B2 | 4/2009 | Horng et al. |
| 7,525,185 B2 | 4/2009 | Yang et al. |
| 7,528,009 B2 | 5/2009 | Chen et al. |
| 7,547,967 B2 | 6/2009 | Jobetto et al. |
| 7,550,320 B2 | 6/2009 | Wang et al. |
| 7,550,843 B2 | 6/2009 | Mihara |
| 7,557,437 B2 | 7/2009 | Yang et al. |
| 7,572,676 B2 | 8/2009 | Leu et al. |
| 7,572,681 B1 | 8/2009 | Huemoeller et al. |
| 7,591,067 B2 | 9/2009 | Wang |
| 7,598,607 B2 | 10/2009 | Chung et al. |
| 7,609,527 B2 | 10/2009 | Tuominen et al. |
| 7,633,765 B1 | 12/2009 | Scanlan et al. |
| 7,639,473 B2 | 12/2009 | Hsu et al. |
| 7,669,320 B2 | 3/2010 | Hurwitz et al. |
| 7,687,823 B2 * | 3/2010 | Amo et al. ............... 257/99 |
| 7,727,818 B2 | 6/2010 | Hsieh et al. |
| 7,964,957 B2 * | 6/2011 | Noguchi et al. ............... 257/699 |
| 2002/0127780 A1 | 9/2002 | Ma et al. |
| 2003/0090883 A1 | 5/2003 | Asahi et al. |
| 2005/0062173 A1 | 3/2005 | Vu et al. |
| 2005/0112798 A1 | 5/2005 | Bjorbell |
| 2006/0151203 A1 * | 7/2006 | Krueger et al. ............... 174/260 |
| 2007/0025092 A1 | 2/2007 | Lee et al. |
| 2007/0131349 A1 | 6/2007 | Tuominen et al. |
| 2007/0227761 A1 | 10/2007 | Tuominen et al. |
| 2007/0246252 A1 | 10/2007 | Buchwalter et al. |
| 2007/0246806 A1 | 10/2007 | Ong et al. |
| 2007/0296065 A1 | 12/2007 | Yew et al. |
| 2008/0094805 A1 | 4/2008 | Tuominen et al. |
| 2008/0105967 A1 | 5/2008 | Yang et al. |
| 2008/0116564 A1 | 5/2008 | Yang et al. |
| 2008/0136002 A1 | 6/2008 | Yang |
| 2008/0136004 A1 | 6/2008 | Yang et al. |
| 2008/0137314 A1 | 6/2008 | Salama et al. |
| 2008/0157336 A1 | 7/2008 | Yang |
| 2008/0157396 A1 | 7/2008 | Yang |
| 2008/0174008 A1 | 7/2008 | Yang et al. |
| 2008/0197469 A1 | 8/2008 | Yang et al. |
| 2008/0197479 A1 * | 8/2008 | Kim et al. ............... 257/698 |
| 2008/0237879 A1 | 10/2008 | Yang |
| 2008/0251908 A1 | 10/2008 | Yang et al. |
| 2008/0258293 A1 | 10/2008 | Yang et al. |
| 2008/0274593 A1 | 11/2008 | Yang et al. |
| 2009/0014872 A1 | 1/2009 | Tuominen et al. |
| 2009/0051025 A1 | 2/2009 | Yang et al. |
| 2009/0101400 A1 | 4/2009 | Yamakoshi |
| 2009/0127686 A1 | 5/2009 | Yang et al. |
| 2009/0129037 A1 | 5/2009 | Yoshino |
| 2009/0133251 A1 | 5/2009 | Tuominen et al. |
| 2009/0140394 A1 | 6/2009 | Bathan et al. |
| 2009/0146297 A1 | 6/2009 | Badakere et al. |
| 2009/0166785 A1 | 7/2009 | Camacho et al. |
| 2010/0006330 A1 | 1/2010 | Fu et al. |
| 2010/0148357 A1 * | 6/2010 | Yang et al. ............... 257/713 |
| 2010/0326707 A1 | 12/2010 | Kwon et al. |
| 2012/0153493 A1 | 6/2012 | Lee et al. |

* cited by examiner

SEMICONDUCTOR PACKAGE WITH EMBEDDED DIE AND MANUFACTURING METHODS THEREOF

BACKGROUND OF THE INVENTION

1. Field of the Invention

The invention relates generally to semiconductor device packages and manufacturing methods thereof. More particularly, the invention relates to semiconductor device packages with an embedded die and manufacturing methods thereof.

2. Description of Related Art

Semiconductor devices have become progressively more complex, driven at least in part by the demand for smaller sizes and enhanced processing speeds. At the same time, there is a demand to further miniaturize many electronic products including these semiconductor devices. Semiconductor devices are typically packaged, and then may be installed on a substrate including electrical circuitry, such as a circuit board. Semiconductor devices may also be installed on a metal layer for enhanced thermal dissipation. This results in space being occupied by both the semiconductor device package and the substrate and/or metal layer, and in surface area on the substrate and/or metal layer being occupied by the semiconductor device package. In addition, additional cost may be incurred by performing packaging, board manufacturing, and assembly as separate processes. It would be desirable to reduce the space occupied by the semiconductor device on the substrate and/or metal layer, and to simplify and combine the packaging, board manufacturing, and assembly processes as applied to the semiconductor device and the substrate and/or metal layer.

It is against this background that a need arose to develop the semiconductor package and related methods described herein.

SUMMARY OF THE INVENTION

One aspect of the invention relates to a semiconductor package. In one embodiment, the semiconductor package includes: (1) a conductive base having an upper surface, a lower surface, and a lateral surface, the lateral surface including a first portion adjacent to the upper surface of the conductive base and a second portion adjacent to the lower surface of the conductive base, where the second sloped portion is sloped inwardly with respect to the lower surface of the conductive base; (2) a die disposed adjacent to the upper surface of the conductive base; (3) a patterned conductive layer; and (4) a dielectric material encapsulating the die, where the dielectric material defines an opening through which the patterned conductive layer is electrically connected to the upper surface of the conductive base.

In another embodiment, the semiconductor package includes: (1) a conductive base having an upper surface, a lower surface, and a lateral surface including a first portion adjacent to the upper surface of the conductive base, a second portion adjacent to the lower surface of the conductive base, and an apex at a junction between the first portion and the second portion; (2) a die disposed adjacent to the upper surface of the conductive base; and (3) a dielectric material having a substantially vertical lateral surface and substantially encapsulating the first portion. The second portion has an angular offset with respect to the substantially vertical lateral surface.

Another aspect of the invention relates to a method of forming a semiconductor package. In one embodiment, the method includes: (1) providing a metal layer having an upper surface and a lower surface; (2) forming a first opening extending from the upper surface of the metal layer partially through the metal layer; (3) disposing a die adjacent to the upper surface of the metal layer; (4) encapsulating the die and at least a portion of the upper surface of the metal layer with a dielectric layer having an upper surface facing away from the die, the dielectric layer substantially filling the first opening; (5) forming a second opening in the dielectric layer, the second opening exposing the upper surface of the metal layer; (6) forming a patterned conductive layer adjacent to the upper surface of the dielectric layer; (7) forming a conductive via extending through the second opening, the conductive via electrically connecting the patterned conductive layer to the metal layer; and (8) forming a third opening extending from the lower surface of the metal layer partially through the metal layer, the third opening being substantially aligned with the first opening.

Other aspects and embodiments of the invention are also contemplated. The foregoing summary and the following detailed description are not meant to restrict the invention to any particular embodiment but are merely meant to describe some embodiments of the invention.

Figure 1:
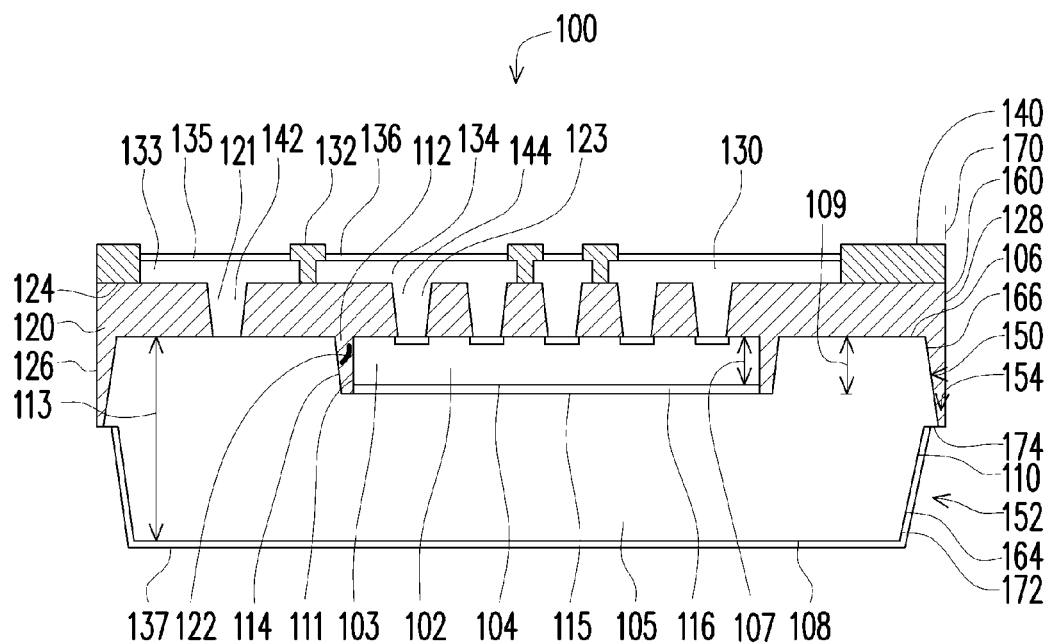
FIG. 1 illustrates a cross section view of a semiconductor package, according to an embodiment of the invention.

The drawings illustrate embodiments of the invention and, together with the description, serve to explain the principles of some embodiments of the invention. Reference will now be made in detail to some embodiments of the invention, examples of which are illustrated in the accompanying drawings. Wherever possible, the same reference numbers are used in the drawings and the descriptions to refer to the same or like features.

DETAILED DESCRIPTION OF THE INVENTION

Attention first turns to FIG. 1, which illustrates a cross section view of a semiconductor package 100, according to an embodiment of the invention. The semiconductor package 100 may include active components (such as a die 102), passive components, or both active and passive components. In FIG. 1, the semiconductor package 100 includes the die 102, a conductive base 105, a dielectric layer 120, and a patterned conductive layer 130. The die 102 has an active surface 103, a back surface 104 opposite to the active surface 103, and a lateral surface 111. The conductive base 105 has an upper surface 106, a lower surface 108 opposite to the upper surface 106, and a lateral surface 110. In one embodiment, the back surface 104 of the die 102 is disposed adjacent to the upper surface 106 of the conductive base 105. The dielectric layer 120 has an upper surface 124, a lower surface 126, and a lateral surface 128 extending from the upper surface 124 to the lower surface 126. The dielectric layer 120 substantially encapsulates the upper surface 106 of the conductive base 105 and the lateral surface 111 and the active surface 103 of the die 102 to provide mechanical stability as well as protection against oxidation, humidity, and other environmental conditions. The patterned conductive layer 130 is disposed adjacent to the upper surface 124 of the dielectric layer 120. The dielectric layer 120 is between the patterned conductive layer 130 and the active surface 103 of the die 102, and is between the patterned conductive layer 130 and the upper surface 106 of the conductive base 105.

The conductive base 105 may be formed from a metal and/or a metal alloy, such as copper and/or an alloy of copper. The conductive base 105 may be a copper foil, and may be referred to as a leadframe. In one embodiment, the thickness 113 of the conductive base 105 may be in the range from about 100 μm to about 300 μm, such as from about 200 μm to about 300 μm. In one embodiment, the thickness 113 of the conductive base 105 is approximately 250 μm.

In one embodiment, the conductive base 105 defines a cavity 112 having walls 114. The die 102 may be disposed at least partially in the cavity 112, such that the back surface 104 of the die 102 is adjacent to a cavity bottom 115 of the cavity 112. The cavity bottom 115 may be included in the upper surface 106 of the conductive base 105. The dielectric layer 120 may substantially fill the portions of the cavity between the die 102 and the walls 114. In one embodiment, a height 107 of the die 102 is no greater than a depth 109 of the cavity 112. The depth 109 of the cavity 112 may be equal to or greater than the height 107 of the die 102. Alternatively, the depth 109 of the cavity 112 may be less than the height 107 of the die 102. In one embodiment, the depth 109 of the cavity 112 may be in the range from about 50 percent of the height 107 of the die 102 to about 100 percent of the height 107 of the die 102, such as from about 60 percent to about 80 percent of the height 107, from about 80 percent to about 100 percent of the height 107, and from about 90 percent to about 100 percent of the height 107. The placement of the die 102 at least partially in the cavity 112 allows for a reduction in a thickness of the dielectric layer 120, and therefore a reduction in a thickness of the package 100. In addition, in one embodiment, if the height 107 of the die 102 is less than or approximately equal to the depth 109 of the cavity 112, the dielectric layer 120 need not be preformed to create an opening corresponding to the die 102 (see FIG. 6D). Alternatively, if the depth 109 of the cavity 112 is less than the height 107 of the die 102, an opening may need to be preformed in the dielectric layer 120, but due to the cavity 112, this opening may be smaller than that shown in FIG. 6C.

The walls 114 of the cavity 112 may be sloped. In one embodiment, the walls 114 may be curved. The walls 114 of the cavity 112 may be sloped such that the walls 114 at the cavity bottom 115 are closer to the die 102 than the walls 114 above the cavity bottom 115.

The die 102 may be attached to the conductive base 105 by a die attach layer 116. In one embodiment, the die attach layer 116 may be formed from a metal and/or a metal alloy to facilitate heat conduction from the die 102 to the conductive base 105. In this embodiment, the process of forming the die attach layer 116 may be referred to as eutectic bonding. This may be desirable for semiconductor packages in which heat dissipation is especially important, such as embedded die power packages. The die attach layer 116 may be formed from soft solder, such as an alloy of tin and lead. Alternatively, the die attach layer 116 may be formed from hard solder, such as an alloy of gold and tin. The formation of the die attach layer 116 from hard solder may be desirable, as this can result in the die attach layer 116 having a more uniform thickness and better heat conduction performance. In other embodiments, the die 102 may be attached to the conductive base 105 by a die attach film, such as epoxy.

Figure 2:
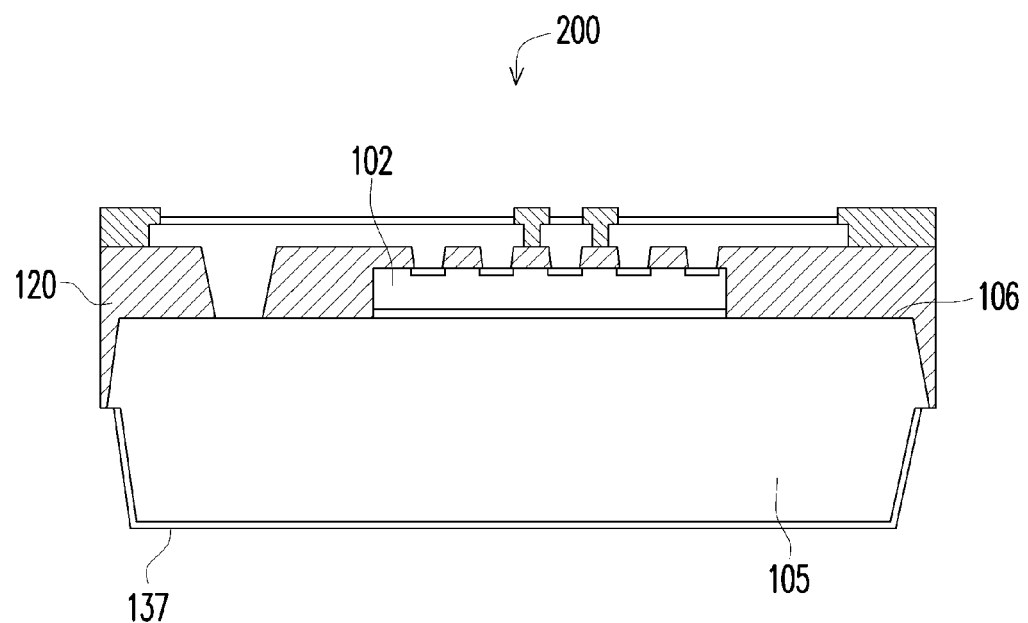
FIG. 2 illustrates a cross section view of a semiconductor package, according to an embodiment of the invention.

In one embodiment, the dielectric layer 120 can be formed from a dielectric material that is polymeric or non-polymeric. For example, the dielectric layer 120 may be formed from, but is not limited to, at least one of liquid crystal polymer (LCP), bismaleimide triazine (BT), prepreg (PP), Ajinomoto Build-up Film (ABF), epoxy, and polyimide. For certain implementations, the dielectric layer 120 can be formed from a dielectric material that is photoimageable or photoactive. In addition, the dielectric layer 120 may be a resin material reinforced with fibers 122, such as glass fibers or Kevlar fibers (aramid fibers), to strengthen the dielectric layer 120. Examples of resin materials that may be reinforced by fibers for use in the dielectric layer 120 include ABF, BT, prepreg, polyimide, LCP, epoxy, and other resin materials. As shown in FIGS. 6B and 6D below, the fibers 290 are initially oriented along a generally horizontal plane within a dielectric layer 614 prior to lamination to form the dielectric layer 214. As shown in FIG. 2, the fibers 122 subsequent to lamination of the dielectric layer 120 are re-oriented, with portions adjacent to the die 102 being pushed along a vertically extending direction of the die 102, and away from the conductive base 105.

As illustrated in FIG. 1, the dielectric layer 120 is formed so as to define openings 121 and 123. The openings 121 may extend from the patterned conductive layer 130 to the upper surface 106 of the conductive base 105, and may expose the upper surface 106. The patterned conductive layer 130 may be electrically connected to the conductive base 105 through the openings 121. The openings 123 may expose portions of the active surface 103 of the die 102. The openings 121 and 123 can have any of a number of shapes. These shapes include a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of these openings can be curved or roughly textured.

As illustrated in FIG. 1, a conductive via 142 may be disposed in each opening 121, and a conductive via 144 may be disposed in each opening 123. For example, the conductive vias 142 and 144 may be plated conductive posts. Alternatively, the conductive via 142 may substantially fill the opening 121, and/or the conductive vias 144 may substantially fill the openings 123. Although one conductive via 142 is shown in FIG. 1, it is contemplated that the package 100 may contain more than one conductive via 142. The conductive via 142 may extend from the patterned conductive layer 130 to the conductive base 105. The conductive via 142 may electrically connect a contact 133 included in patterned conductive layer 130 to the conductive base 105. In one embodiment, the contact 133 may be a ground contact for the conductive base 105. The conductive vias 144 may extend from the patterned conductive layer 130 to the die 102. The conductive vias 144 may electrically connect contacts 134 to the active surface 103 of the die 102. In one embodiment, the contacts 134 may include power, signal, and/or ground contacts for die 102.

In one embodiment, each of the patterned conductive layers and conductive vias shown in FIG. 1 can be formed from a metal, a metal alloy, a matrix with a metal or a metal alloy dispersed therein, or another suitable electrically conductive material. For example, each of the patterned conductive layers and conductive vias shown in FIG. 1 can be formed from aluminum, copper, titanium, or a combination thereof. The patterned conductive layers and conductive vias shown in FIG. 1 can be formed from the same electrically conductive material or different electrically conductive materials.

As illustrated in FIG. 1, openings 132 defined by the patterned conductive layer 130 can be substantially filled by an additional dielectric layer 140. The additional dielectric layer 140 may be formed from solder mask (solder resist), such as dry film imageable solder mask, or another type of patternable layer or dielectric layer. The openings 132 and the openings in the additional dielectric layer 140 that expose the electrical contacts 133 and 134 can have any of a number of shapes. These shapes include a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of these openings can be curved or roughly textured.

As illustrated in FIG. 1, the contacts 133 and 134 may be plated with surface finish layers 135 and 136, respectively. In one embodiment, the surface finish layers 135 and 136 can be formed similarly to the patterned conductive layers and conductive vias shown in FIG. 1, as described previously. Alternatively, the surface finish layers 135 and 136 may be formed differently. For example, the surface finish layers 135 and 136 may be formed from at least one of tin, nickel, and gold, or an alloy including tin or including nickel and gold. The surface finish layers 135 and 136 can be formed from the same electrically conductive material or different electrically conductive materials.

FIG. 2 illustrates a cross section view of a semiconductor package 200, according to an embodiment of the invention. The semiconductor package 200 is in many respects similar to the semiconductor package 100 described with reference to FIG. 1, so aspects of the semiconductor package 200 that are different are discussed here. In this embodiment, the die 102 may be disposed adjacent to the upper surface 106 of the conductive base 105 without being disposed in a cavity. In particular, the cavity 112 (see FIG. 1) is not formed in the conductive base 105. Because the die 102 is disposed adjacent to the upper surface 106 of the conductive base 105 without being disposed in a cavity, the dielectric layer 120 is preformed to create an opening corresponding to the die 102 (see FIG. 6B).

Referring to FIG. 1, in one embodiment the conductive base 105 defines openings 150 and 152. The openings 150 and 152 may also be referred to as cavities 150 and 152, and/or as indentations 150 and 152. The openings 150 and 152 each extend partially through the conductive base 105, with the openings 150 extending from the upper surface 106 of the conductive base 105, and the openings 152 extending from the lower surface 108 of the conductive base 105. Each opening 150 may be positioned opposite a corresponding one of the openings 152. In one embodiment, the openings 150 may be substantially filled by the dielectric layer 120. Each opening 152 may expose the dielectric layer 120. Alternatively, in one embodiment, each opening 150 may be separated from the corresponding one of the openings 152 by a portion (not shown) of the conductive base 105.

As illustrated in FIG. 1, the lateral surface 110 may include a lower portion 164 and an upper portion 166. The lower portion 164 may be sloped, and may extend between the lower surface 108 of the conductive base 105 and the upper portion 166. In one embodiment, the lower portion 164 may be sloped inwardly with respect to the lower surface 108. The upper portion 166 of the lateral surface 110 may extend between the upper surface 106 of the conductive base 105 and the lower portion 164. The lower portion 164 corresponds to a boundary of the opening 152. The upper portion 166 of the lateral surface 110 may also be sloped, and may be substantially covered by the dielectric layer 120. In one embodiment, the lateral surface 110 may include an apex 154 at a junction between the lower portion 164 and the upper portion 166.

In one embodiment, the package 100 includes a side wall 160. The side wall 160 may include the lateral surface 128 of the dielectric layer 120. In one embodiment, the side wall 160 may also include a portion (not shown) of the lateral surface 110 of the conductive base 105 that may extend from the lower portion 164 to the upper portion 166. This portion of the lateral surface 110 and the lateral surface 128 may be substantially coplanar.

Referring to FIG. 1, the lower portion 164 and/or the upper portion 166 may have a substantially concave profile. The lower portion 164 and/or the upper portion 166 may be rounded and/or curved inwards toward the die 102. In one embodiment, the lower portion 164 and/or the upper portion 166 may include surface non-uniformities or roughness in the form of small peaks, such as asperities, that may be rounded and/or curved outwards from the die 102.

As illustrated in FIG. 1, the lower surface 108 and the lower portion 164 of the lateral surface 110 may be plated with surface finish layer (plating layer) 137. In one embodiment, the surface finish layer 137 can be formed similarly to the patterned conductive layers and conductive vias shown in FIG. 1, as described previously. Alternatively, the surface finish layer 137 may be formed differently. For example, the surface finish layer 137 may be formed from at least one of tin, nickel, and gold, or an alloy including tin or including nickel and gold.

In one embodiment, the lateral surface 128 of the dielectric layer 120 may define a first plane 170. The lateral surface 128 may be substantially vertical. The lower portion 164 may have an angular offset with respect to the lateral surface 128. The lower portion 164 may include a lower part 172 adjacent to the lower surface 108 of the conductive base 105, and an upper part 174 extending between the lower part 172 and the upper portion 166. The lower part 172 may be sloped relative to the first plane 170 by less than or approximately equal to 15 degrees, such as in the range from about 5 degrees to about 10 degrees, and from about 10 degrees to about 15 degrees.

In one embodiment, the lower portion 164 may include an indentation in the lateral surface 110. For example, the lower part 172 may be indented relative to the upper part 174. The indentation may circumscribe the package 100.

Figure 3:
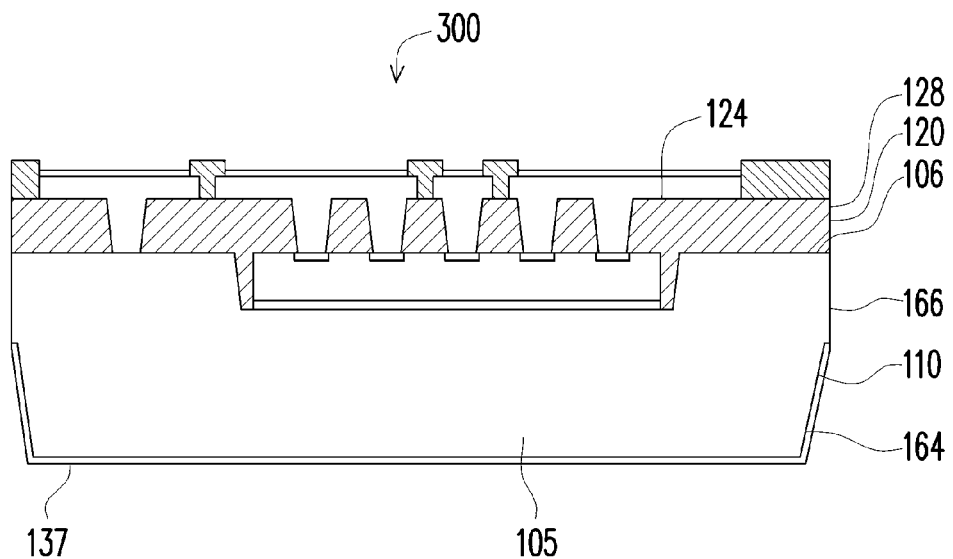
FIG. 3 illustrates a cross section view of a semiconductor package, according to an embodiment of the invention.

FIG. 3 illustrates a cross section view of a semiconductor package 300, according to an embodiment of the invention. The semiconductor package 300 is in many respects similar to the semiconductor package 100 described with reference to FIG. 1, so aspects of the semiconductor package 300 that are different are discussed here. In this embodiment, the upper portion 166 of the lateral surface 110 may be substantially coplanar with the lateral surface 128 of the dielectric layer 120. The upper portion 166 may be exposed, such that neither the dielectric layer 120 nor the surface finish layer 137 cover the upper portion 166. The surface finish layer 137 may cover the lower portion 164 without covering the upper portion 166. Alternatively, the upper portion 166 may be covered by the surface finish layer 137.

Figure 4:
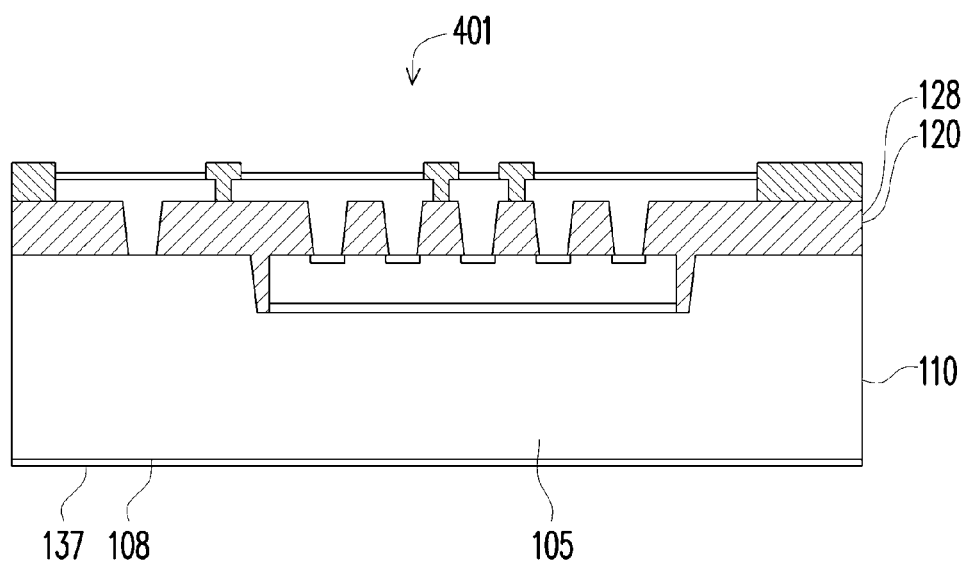
FIG. 4 illustrates a cross section view of a semiconductor package, according to an embodiment of the invention.

FIG. 4 illustrates a cross section view of a semiconductor package 401, according to an embodiment of the invention. The semiconductor package 401 is in many respects similar to the semiconductor package 100 described with reference to FIG. 1, so aspects of the semiconductor package 401 that are different are discussed here. Unlike the embodiment of FIG. 1, the entire lateral surface 110 may be substantially coplanar with the lateral surface 128 of the dielectric layer 120. The surface finish layer 137 may cover the lower surface 108 without covering the lateral surface 110. Alternatively, the surface finish layer 137 may cover the lower surface 108 and the lateral surface 110 of the conductive base 105.

Alternatively, the lateral surface 110 may include an upper part (not shown) that has similar characteristics to the upper part 166 shown in FIG. 1. In particular, the upper part (not shown) may be sloped and may be substantially covered by the dielectric layer 120. In this embodiment, the remainder of the lateral surface 110 may be substantially coplanar with the lateral surface 128 of the dielectric layer 120. The surface finish layer 137 may cover the lower surface 108 and the remainder of the lateral surface 110. Alternatively, the surface finish layer 137 may cover the lower surface 108 without covering any of the lateral surface 110.

Figure 5:
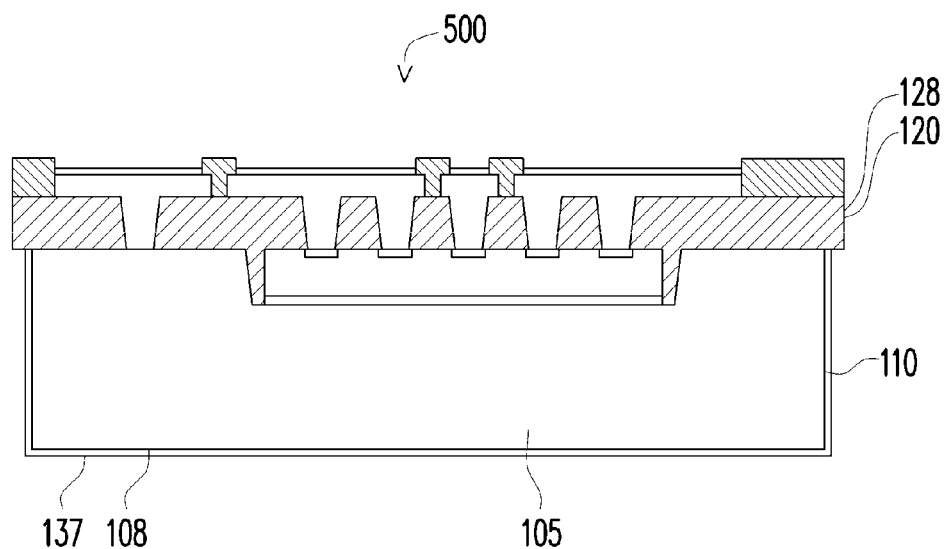
FIG. 5 illustrates a cross section view of a semiconductor package, according to an embodiment of the invention.

FIG. 5 illustrates a cross section view of a semiconductor package 500, according to an embodiment of the invention. The semiconductor package 500 is in many respects similar to the semiconductor package 401 described with reference to FIG. 4, so aspects of the semiconductor package 500 that are different are discussed here. In this embodiment, the dielectric layer 120 may have a lateral extent larger than a lateral extent of the conductive base 105, such that the lateral surface 128 of the dielectric layer 120 is not coplanar with the lateral surface 110, and is not coplanar with the surface finish layer 137.

Alternatively, the lateral surface 110 may include an upper part (not shown) that has similar characteristics to the upper part 166 shown in FIG. 1. In particular, the upper part (not shown) may be sloped and may be substantially covered by the dielectric layer 120. In this embodiment, the dielectric layer 120 may have a lateral extent larger than a lateral extent of the conductive base 105, such that the lateral surface 128 of the dielectric layer 120 is not coplanar with any portion of the lateral surface 110, and is not coplanar with the surface finish layer 137.

Figure 6A:
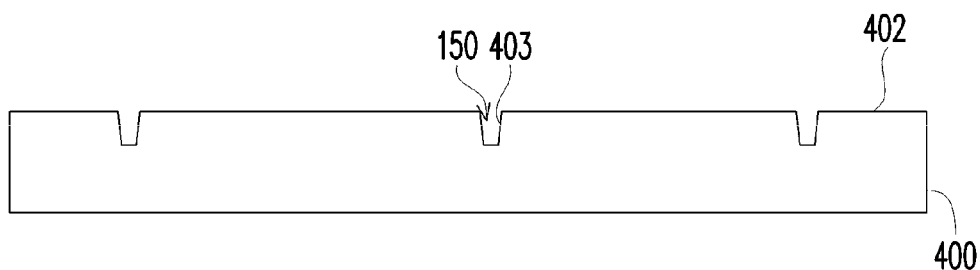
FIG. 6A through FIG. 6P illustrate a method of manufacturing a semiconductor package, according to embodiments of the invention.
Figure 6B:
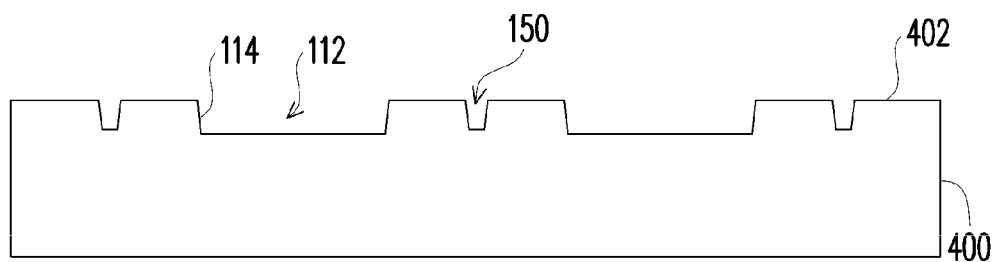
Figure 6C:
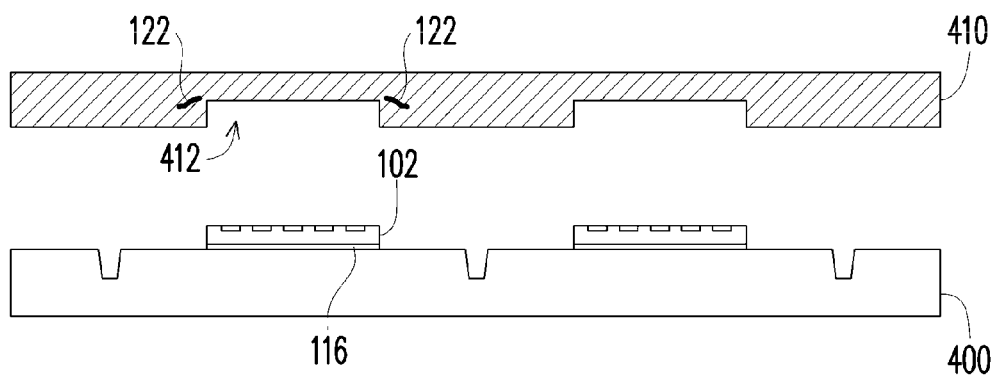
Figure 6D:
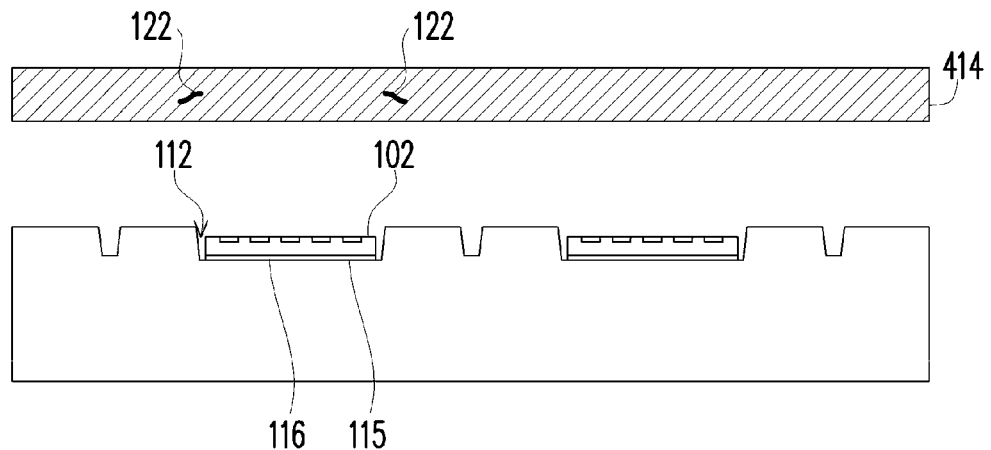
Figure 6E:
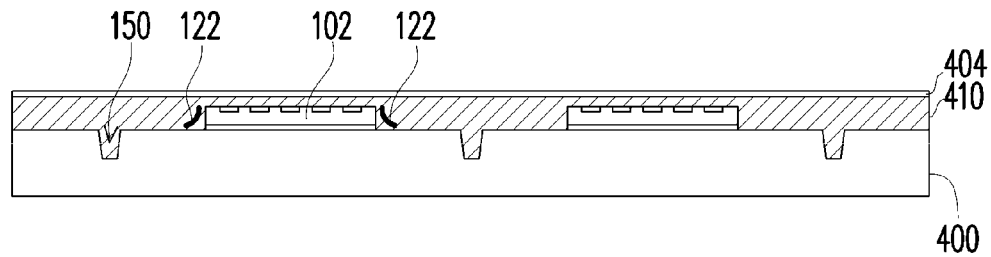
Figure 6F:
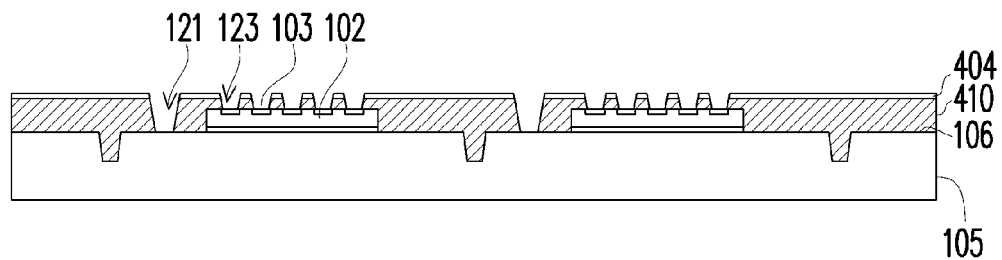
Figure 6G:
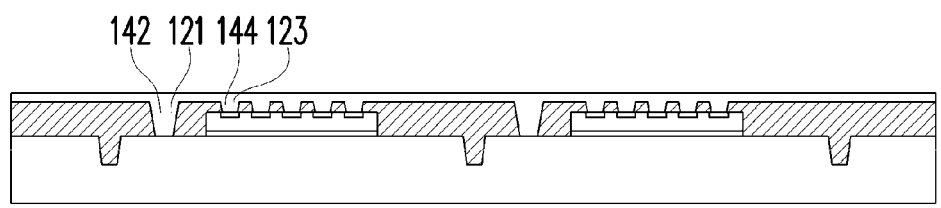
Figure 6H:
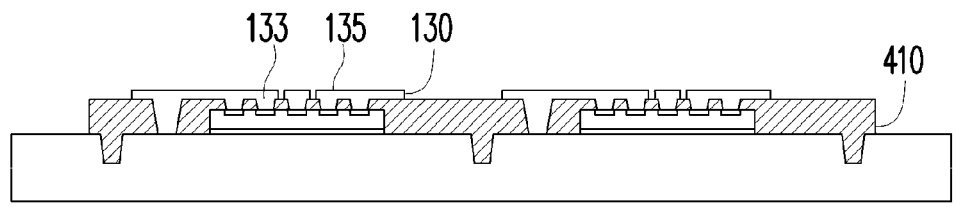
Figure 6I:
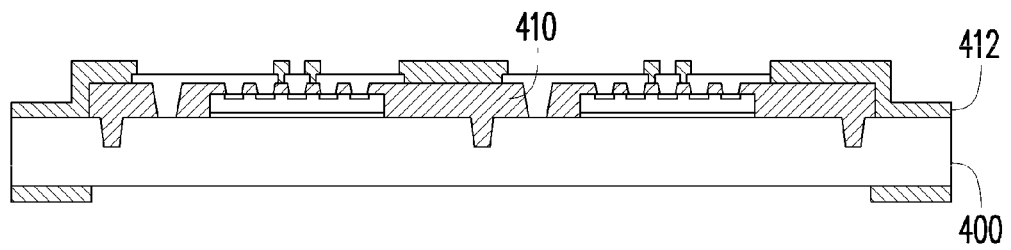
Figure 6J:
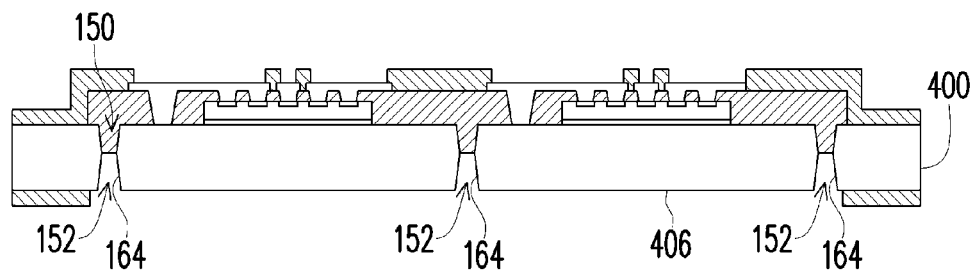
Figure 6K:
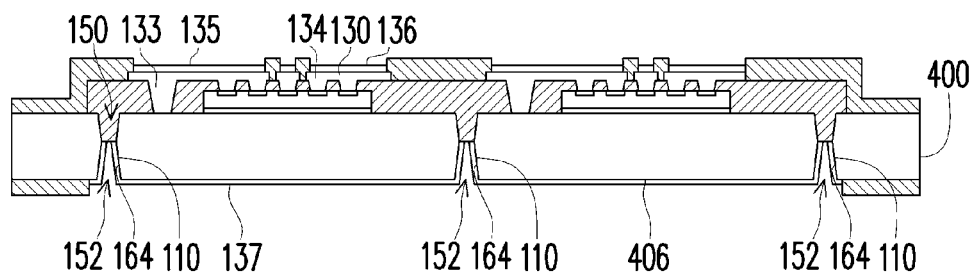
Figure 6L:
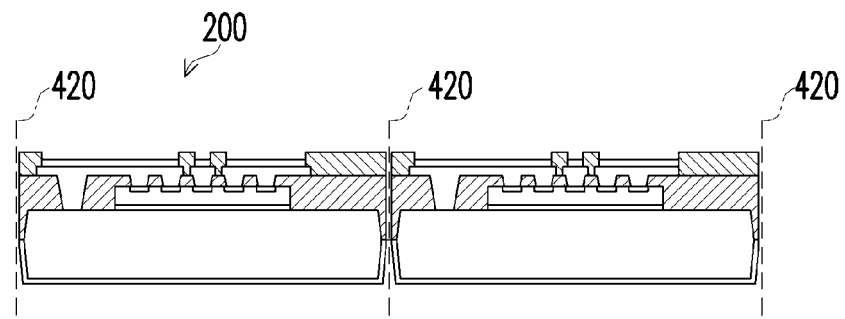
Figure 6M:
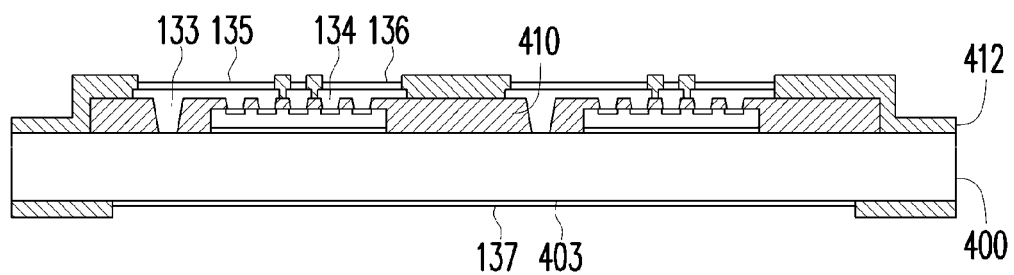
Figure 6N:
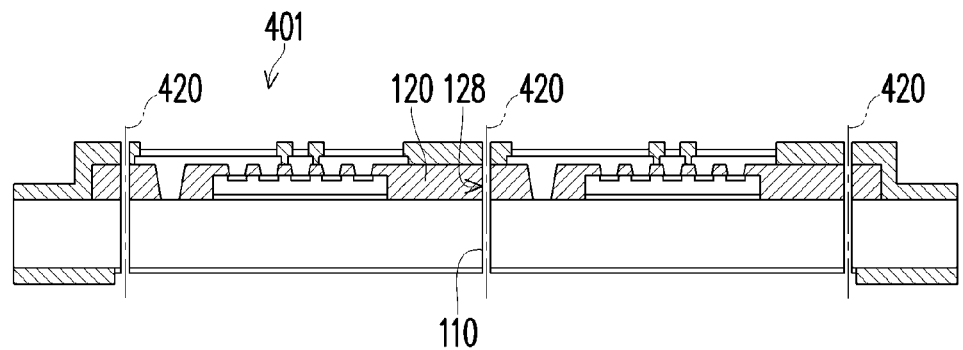
Figure 6O:
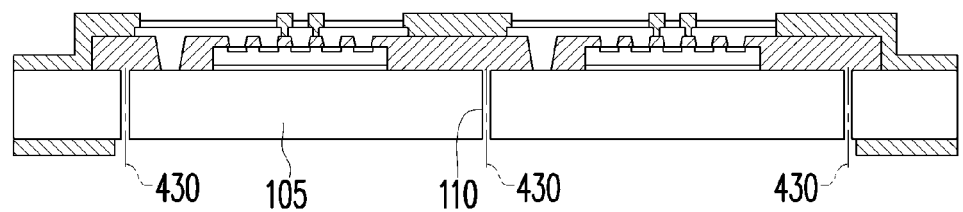
Figure 6P:
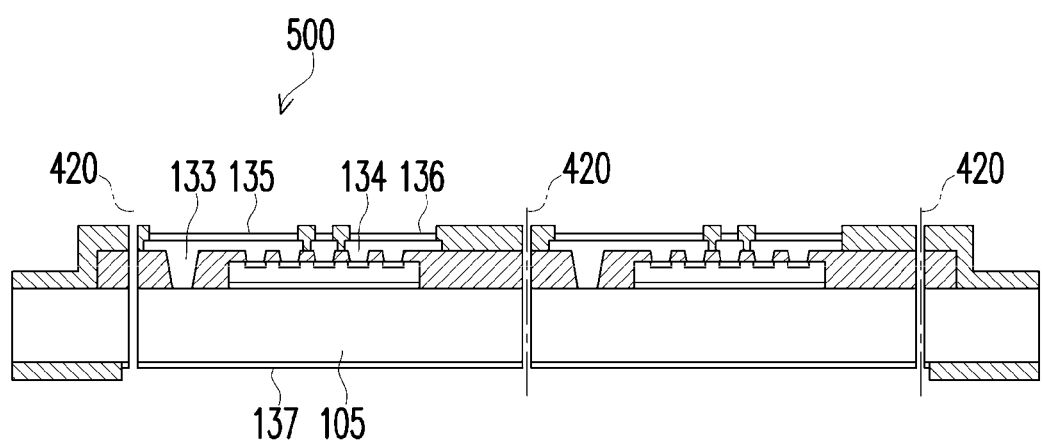

FIG. 6A through FIG. 6P illustrate a method of manufacturing a semiconductor package, according to embodiments of the invention. For ease of presentation, the following manufacturing operations are described with reference to the package 100 of FIG. 1 and/or the package 200 of FIG. 2. However, it is contemplated that the manufacturing operations can be similarly carried out to form other semiconductor packages that may have different internal structure from the packages 100 and 200, such as the package 300 illustrated in FIG. 3. It is also contemplated that the manufacturing operations can be carried out to form a substrate strip including an array of connected semiconductor packages, each of which may correspond to a package such as those illustrated in FIGS. 1-3. A first embodiment of the method is described in FIG. 6A through FIG. 6L. A second embodiment of the method is described in FIG. 6A through FIG. 6I followed by FIG. 6M through FIG. 6N. The second embodiment of the method may be used to form the package 401 illustrated in FIG. 4. A third embodiment of the method is described in FIG. 6A through FIG. 6I followed by FIG. 6O through FIG. 6P. The third embodiment of the method may be used to form the package 500 illustrated in FIG. 5. As described in FIG. 6L, FIG. 6N, FIG. 6O, and FIG. 6P, the array of connected semiconductor packages may be singulated into individual packages such as those illustrated in FIGS. 1-5.

Referring first to FIG. 6A, a base substrate strip 400 is provided. The base substrate strip 400 has similar material composition and thickness characteristics to those previously described for the conductive base 105 of FIGS. 1 and 2. In one embodiment, the openings 150 may be formed in the base substrate strip 400, and extend partially through the base substrate strip 400 from an upper surface 402 of the base substrate strip 400. Each opening 150 may serve as an alignment mark to facilitate singulation (see FIGS. 6K and 6L). In one embodiment, the openings 150 are formed by chemical etching. Walls 403 of the openings 150 may be sloped. In one embodiment, the walls 403 may be curved. The degree of the slope of the walls 403 away from a plane substantially perpendicular to the upper surface 402 may depend on the chemical solution that is used for the etching. Alternatively, the openings 150 may not be formed in the base substrate strip 400.

Alternatively, as illustrated in FIG. 6B, the cavity 112 may be formed in the base substrate strip 400. The cavity 112 may be formed in addition to the openings 150. The semiconductor device 502 may be at least partially disposed in the cavity 504. In one embodiment, the cavity 112 is formed by chemical etching. The walls 114 of the cavity 112 may be sloped. In one embodiment, the walls 114 may be curved. The degree of the slope of the walls 114 away from a plane substantially perpendicular to the upper surface 402 may depend on the chemical solution that is used for the etching.

As illustrated in FIG. 6C, the die 102 is disposed adjacent to the base substrate strip 400. The die attach layer 116 may be disposed between the die 102 and the base substrate strip 400. As described previously with reference to FIG. 1, the die 102 may be attached to the base substrate strip 400 by eutectic bonding. In one embodiment of eutectic bonding, the die attach layer 116 may be formed from soft solder, such as an alloy of tin and lead. In this embodiment, a wire formed from the alloy of tin and lead may be melted and then dispensed on the base substrate strip 400 at the location at which the die 102 is to be attached. In another embodiment of eutectic bonding, the die attach layer 116 may be formed from hard solder, such as an alloy of gold and tin. The alloy of gold and tin may be disposed on a semiconductor wafer such that the alloy of gold and tin is attached to the die 102. The die 102 can then be attached to the base substrate strip 400 directly by melting the alloy of gold and tin, without needing a separate dispensing step. Alternatively, if eutectic bonding is not used, the die attach layer 116 may be formed from an adhesive material such as epoxy. The adhesive material may be dispensed on the base substrate strip 400 at the location at which the die 102 is to be attached.

Referring to FIG. 6C, a dielectric layer 410 is provided, wherein the dielectric layer 410 is pre-formed with a set of openings 412, and positions of the openings 412 correspond to the positions of the semiconductor devices 102. The dielectric layer 410 has similar characteristics to the dielectric layer 120 previously described with reference to FIG. 1. In one embodiment, the dielectric layer 410 includes a fiber-reinforced resin material, such as a prepreg material, including the fibers 122 to strengthen the dielectric layer 410. As shown in FIG. 6C, the fibers 122 are initially oriented along a generally horizontal plane within the dielectric layer 410.

Alternatively, as illustrated in FIG. 6D, the die 102 is disposed at least partially in the cavity 112, and adjacent to the cavity bottom 115. The die attach layer 116 may be disposed between the die 102 and the cavity bottom 115. In a manner similar to that described previously with reference to FIG. 6C, the die 102 may be attached to the cavity bottom 115 by eutectic bonding or by using an adhesive such as epoxy. Also, a dielectric layer 414 is provided. As described previously with reference to FIG. 1, in one embodiment, the dielectric layer 414 need not be pre-formed with any openings corresponding to the positions of the semiconductor devices 102. This simplifies the process of forming the package 100 of FIG. 1, and similar packages in which the die 102 is disposed in the cavity 112. The dielectric layer 414 has similar characteristics to the dielectric layer 120 previously described with reference to FIG. 1. In one embodiment, the dielectric layer 414 includes a fiber-reinforced resin material, such as a prepreg material, including the fibers 122 to strengthen the dielectric layer 414. As shown in FIG. 6C, the fibers 122 are initially oriented along a generally horizontal plane within the dielectric layer 414.

As illustrated, FIGS. 6E through 6L follow FIG. 6C to form the package 200 of FIG. 2, though it would be understood by one of ordinary skill in the art that similar steps can follow FIG. 6D to form the package 100 of FIG. 1 and/or the package 300 of FIG. 3.

As illustrated in FIG. 6E, the dielectric layer 410 is disposed adjacent to the base substrate strip 400, and covering the die 102. The dielectric layer 410 may substantially fill the openings 150. As described previously with reference to FIG. 1, for embodiments that include the cavity 112, the dielectric layer 414 (see FIG. 6D) may also substantially fill a remaining portion of the cavity 112 not already filled by the die 102. The dielectric layer 410 may separate a conductive sheet 404 from the die 102. The dielectric layer 410 shown in FIG. 6E includes the dielectric layer 120 of FIG. 2. In one embodiment, the fibers 122 subsequent to lamination of the dielectric layer 410 are re-oriented, with portions adjacent to the die 102 being pushed along a vertically extending direction of the die 102, and away from the substrate strip 400. The conductive sheet 404, such as a copper foil, may be disposed adjacent to the dielectric layer 410 to form, for example, a resin-coated copper layer that covers the die 102. The dielectric layer 410 may have a single resin layer, or may include a first sublayer made of resin and a second sublayer made of reinforced resin, such as resin reinforced with glass fibers and/or Kevlar fibers.

In another embodiment, the dielectric layer 410 may be formed from a prepreg material, and the conductive sheet 404 may be disposed adjacent to the dielectric layer 410. The prepreg material may be disposed adjacent to the base substrate strip 400, and may be pre-formed to define openings at the locations of the die 102 (see FIG. 6C). The prepreg material may be formed of one prepreg layer, or of two or more prepreg layers. Alternatively, the dielectric layer 410 may include a combination of a prepreg sublayer and a resin sublayer, and the conductive sheet 404 may be disposed adjacent to the dielectric layer 410. The prepreg sublayer may be disposed adjacent to the base substrate strip 400, and may be pre-formed to define openings at the locations of the die 102 (see FIG. 6C). The resin sublayer may be disposed adjacent to the prepreg sublayer, and may also be disposed adjacent to the base substrate strip 400 within the openings defined by the prepreg sublayer (see FIG. 6C).

In another embodiment, the dielectric layer 410 may be formed from an epoxy molding compound, such as an encapsulant material, and the conductive sheet 404 may be disposed adjacent to the dielectric layer 410.

In one embodiment, the dielectric layer 410 may be laminated on the base substrate strip 400. Alternatively, the dielectric layer 410 can be formed using any of a number of molding techniques, such as injection molding. Once applied, the molding material is hardened or solidified, such as by lowering the temperature to below a melting point of the molding material, thereby forming the dielectric layer 410. Alternatively, the dielectric layer 410 can be formed using any of a number of coating techniques, such as printing, spinning, or spraying.

In one embodiment, the conductive sheet 404 may be attached to the dielectric layer 410 prior to disposing the dielectric layer 410 adjacent to the base substrate strip 400. In one embodiment, the dielectric layer 410, with the conductive sheet 404 already attached, may be disposed adjacent to the base substrate strip 400.

As illustrated in FIG. 6F, openings including the openings 121 and 123 are formed. The openings 121 extend through the conductive sheet 404 and the dielectric layer 410 to expose the upper surface 106 of the conductive base 105. The openings 123 extend through the conductive sheet 404 and the dielectric layer 410 to expose the active surface 103 of the semiconductor device 202. The openings 121 and 123 may be formed by laser drilling, mechanical drilling, or other suitable approaches known in the art.

As illustrated in FIG. 6G, the openings 121 and 123 are filled with a conductive material to form the conductive vias 142 and 144. The conductive vias 142 and 144 may be formed using any of a number of coating techniques, such as electroless plating and/or electrolytic plating.

As illustrated in FIG. 6H, the patterned conductive layer 130, including the contacts 133 and 134, is formed adjacent to the dielectric layer 410. The patterned conductive layer 130 can be formed by an additive process, a semi-additive process, or a subtractive process. The patterned conductive layer 130 may include a set of pads and a set of traces, which can be formed substantially simultaneously in a common process operation.

As illustrated in FIG. 6I, a dielectric layer 412 is disposed adjacent to the dielectric layer 410 and the base substrate strip 400. The dielectric layer 412 shown in FIG. 6E includes the dielectric layer 140 of FIG. 1. The dielectric layer 412 may be formed in a manner similar to that described previously for the dielectric layer 410 with reference to FIG. 6E.

As illustrated in FIG. 6J, the openings 152 are formed in the base substrate strip 400. In one embodiment, the openings 152 may extend through the base substrate strip 400 from the lower surface 406 such that the openings 152 expose the dielectric layer 120. Alternatively, the openings 152 may extend partially through the base substrate strip 400 from a lower surface 406 of the base substrate strip 400, and may be separated from the corresponding one of the openings 152 by a portion (not shown) of the conductive base 105. A thickness of this portion (not shown) may be significantly less than a thickness of other portions of the base substrate strip 400, which may facilitate singulation.

As described previously with reference to FIG. 1, each opening 150 may be positioned opposite a corresponding one of the openings 152 such that each opening 150 is substantially aligned with the corresponding one of the openings 152. Each opening 150 may have substantially the same width as the corresponding one of the openings 152, or may have a different width from the corresponding one of the openings 152.

In one embodiment, the openings 152 are formed by chemical etching. The lower portions 164 of walls of the openings 152, as previously described with reference to FIG. 1, may be substantially concave. The lower portions 164 may be rounded and/or curved inwards toward the die 102. The degree of the slope of the lower portions 164 away from the plane 170 (see FIG. 1) may depend on the chemical solution that is used for the etching.

As illustrated in FIG. 6K, the surface finish layers 135 and 136 are formed adjacent to the contacts 133 and 134, respectively. The surface finish layer 137 is formed adjacent to the lower surface 108 and the lower portion 164 of the lateral surface 110 of the conductive base 105. The surface finish layers 135, 136, and 137 may be formed using an electroless nickel/immersion gold process.

As illustrated in FIG. 6L, singulation may then be performed along the dashed lines 420 to obtain individual packages, such as the packages 200 of FIG. 2. The singulation results in cutting slits that subdivide the base substrate strip 400 into the conductive base 105 (see FIGS. 1-3) having the lateral surface 110 including the lower portion 164.

Referring to FIG. 1, if a small size knife and/or saw is used for the singulation and/or punching step described with reference to FIG. 6L, singulation may be performed at a location corresponding to the opening 150. Performing singulation at this location when using a small, lower cost saw may be desirable because the thickness of the conductive base 105 at this location is reduced due to the opening 150. In this embodiment, a cutting slit resulting from singulation along the dashed lines 420 extends through the dielectric layer 120, the first opening 150, and the corresponding second opening 152. At this location, the side wall 160 of the package 100 resulting from the singulation is a substantially coplanar surface that includes the lateral surface 128 of the dielectric layer 120. The side wall 160 may be substantially perpendicular to the upper surface 124 of the dielectric layer 120. In this embodiment, the lower portion 164 of the lateral surface 110 corresponds to a boundary of the opening 152. The upper portion 166 of the lateral surface 110 may be substantially covered by the dielectric layer 120.

Referring to FIG. 3, if a large size knife and/or saw is used for the singulation and/or punching step described with reference to FIG. 6L, singulation may be performed at a location displaced from the opening 150. In this embodiment, a cutting slit resulting from singulation along the dashed lines 420 extends through the dielectric layer 120, the upper portion 166 of the conductive base 105, and the second opening 152 under the upper portion 166. At this location, the side wall 160 of the package 100 resulting from the singulation is a substantially coplanar surface that includes the lateral surface 128 of the dielectric layer 120 and the upper portion 166 of the lateral surface 110 of the conductive base 105. The side wall 160 may be substantially perpendicular to the upper surface 124 of the dielectric layer 120. In this embodiment, the upper portion 166 of the lateral surface 110 may extend from the lateral surface 128 of the dielectric layer 120 to the lower portion 164 of the lateral surface 110. The singulation may be displaced from the opening 150, unlike the embodiment of FIG. 1. In one embodiment, after singulation the surface finish layer 137 may be formed adjacent to the upper portion 166 of the lateral surface 110.

Referring to FIGS. 1 and 6L, in an alternative embodiment, a cutting slit resulting from singulation and/or punching along the dashed lines 420 may extend through the dielectric layer 120, the first opening 150, and the corresponding second opening 152 under the first opening 150. In this embodiment, the cutting slit also extends through a portion (not shown) of the conductive base 105 that separates the first opening 150 from the corresponding second opening 152. After singulation, the lower portion 164 of the lateral surface 110 may extend between the lower surface 108 of the conductive base 105 and the lateral surface 128 of the dielectric layer 120.

As illustrated in FIG. 6M, in an alternative embodiment the surface finish layers 135 and 136 are formed adjacent to the contacts 133 and 134, respectively. The surface finish layer 137 is formed adjacent to a lower surface 403 of the base substrate strip 400. The surface finish layers 135, 136, and 137 may be formed using an electroless nickel/immersion gold process. As described previously with reference to FIG. 6A, the openings 150 may be formed in the base substrate strip 400, or may not be formed in the base substrate strip 400.

As illustrated in FIG. 6N, singulation may then be performed along the dashed lines 420 to obtain individual packages, such as the packages 401 of FIG. 4. The singulation results in cutting slits that subdivide the base substrate strip 400 into the conductive base 105 (see FIG. 4) having the lateral surface 110. In this embodiment, the lateral surface 110 may be substantially coplanar with the lateral surface 128 of the dielectric layer 120. Alternatively, a part (not shown) of the lateral surface 110 may be substantially covered by the dielectric layer 120, and a remaining part of the lateral surface 110 may be substantially coplanar with the lateral surface 128. Because the singulation of the base substrate strip 400 takes place after the formation of the surface finish layer 137 on the lower surface 108 of the conductive base 105, the lateral surface 110 is not covered by the surface finish layer 137. In one embodiment, after singulation the surface finish layer 137 may be formed adjacent to at least part of the lateral surface 110.

As illustrated in FIG. 6O, in another alternative embodiment singulation of the base substrate strip 400 may be performed along the dashed lines 430. The singulation results in cutting slits that subdivide the base substrate strip 400 into the conductive base 105 (see FIG. 5) having the lateral surface 110. This singulation may be performed with a first saw suitable for cutting metal materials. In this embodiment, the lateral surface 110 may be substantially planar. Alternatively, a part (not shown) of the lateral surface 110 may be sloped relative to a plane defined by the dashed lines 430, and may be substantially covered by the dielectric layer 120.

As illustrated in FIG. 6P, the surface finish layers 135 and 136 are formed adjacent to the contacts 133 and 134, respectively. The surface finish layer 137 may be formed adjacent to the lower surface 108. In one embodiment, the surface finish layer 137 may also be formed adjacent to at least part of the lateral surface 110 of the conductive base 105. The surface finish layers 135, 136, and 137 may be formed using an electroless nickel/immersion gold process.

Singulation of the dielectric layer 120 may then be performed along the dashed lines 420 to obtain individual packages, such as the packages 500 of FIG. 5. This singulation may be performed with a second saw suitable for cutting dielectric materials, where the second saw is different from the first saw that singulated the base substrate strip 400 with reference to FIG. 6O. If the openings 150 are present in the base substrate strip 400, the cutting slits may be aligned with the openings 150.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily drawn to scale, and manufacturing tolerances may result in departure from the artistic renditions herein. There may be other embodiments of the present invention which are not specifically illustrated. Thus, the specification and the drawings are to be regarded as illustrative rather than restrictive. Additionally, the drawings illustrating the embodiments of the present invention may focus on certain major characteristic features for clarity. Furthermore, modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a conductive base including an upper surface, a lower surface, and a lateral surface, the lateral surface including a first portion adjacent to the upper surface of the conductive base and a second portion adjacent to the lower surface of the conductive base, wherein the second portion is sloped inwardly with respect to the lower surface of the conductive base;
   a die disposed adjacent to the upper surface of the conductive base;
   a patterned conductive layer; and
   a dielectric material encapsulating the die, wherein the dielectric material defines an opening through which the patterned conductive layer is electrically connected to the upper surface of the conductive base.

2. The semiconductor package of claim 1, wherein the first portion is sloped.

3. The semiconductor package of claim 2, wherein the dielectric material substantially encapsulates the first portion.

4. The semiconductor package of claim 1, wherein the lateral surface of the conductive base includes an apex at a junction between the first portion and the second portion.

5. The semiconductor package of claim 1, wherein the second portion includes an indentation that circumscribes the semiconductor package.

6. The semiconductor package of claim 1, further comprising a plating layer coupled to the lower surface of the conductive base.

7. The semiconductor package of claim 1, wherein the conductive base defines a cavity in the upper surface of the conductive base.

8. A semiconductor package, comprising:
   a conductive base including an upper surface, a lower surface, and a lateral surface, the lateral surface including a first portion adjacent to the upper surface of the conductive base, a second portion adjacent to the lower surface of the conductive base, and an apex at a junction between the first portion and the second portion;
   a die disposed adjacent to the upper surface of the conductive base; and
   a dielectric material including a substantially vertical lateral surface and substantially encapsulating the first portion, wherein the dielectric material defines an opening to allow for a patterned conductive layer electrically connected to the upper surface of the conductive base;
   wherein the second portion has an angular offset with respect to the substantially vertical lateral surface of the dielectric material.

9. The semiconductor package of claim 8, wherein:
   the conductive base defines a cavity in the upper surface of the conductive base.

10. The semiconductor package of claim 9, wherein:
    the cavity has a first height;
    the die has a second height; and
    the first height is at least as large as the second height.

11. The semiconductor package of claim 9, wherein the die is positioned in the cavity.

12. The semiconductor package of claim 8, wherein the second portion includes an indentation.

13. The semiconductor package of claim 12, wherein the indentation circumscribes the semiconductor package.

14. The semiconductor package of claim 8, further comprising a plating layer coupled to the lower surface of the conductive base.

15. A semiconductor package, comprising:
    a patterned dielectric layer defining openings, the patterned dielectric layer including a lower surface;
    a base portion of a conductive material, wherein the base portion includes
       an upper surface;
       a cavity in the upper surface, wherein at least a portion of the upper surface is substantially coplanar with the lower surface of the patterned dielectric layer; and
       lateral surfaces at the periphery of the base portion, the lateral surfaces each having an upper portion and a lower portion, wherein the conductive material is a continuous solid structure between the lower portions of the lateral surfaces, wherein the lower portion is sloped inwardly with respect to a lower surface of the base portion;
    a die disposed in the cavity, wherein the patterned dielectric layer fills at least a portion of the cavity between the die and a sidewall of the cavity; and
    a patterned conductive layer disposed over the dielectric layer and electrically connected to the base portion through the openings defined in the patterned dielectric layer.

16. The semiconductor package of claim 15, further comprising a conductive die attach layer between the die and the cavity.

17. The semiconductor package of claim 15, wherein at least one sidewall of the cavity is sloped.

18. The semiconductor package of claim 15, further comprising a conductive post positioned within an opening in the dielectric layer, wherein the patterned conductive layer is electrically connected to the base portion through the conductive post.

19. The semiconductor package of claim 15, further comprising a second dielectric layer, wherein the patterned conductive layer defines vias and the second dielectric layer fills at least one of the vias defined by the patterned conductive layer.

20. The semiconductor package of claim 15, wherein a lateral surface of the base portion is at least partially exposed at a periphery of the package.

* * * * *